(12) United States Patent
Laidig et al.

(10) Patent No.: US 7,175,940 B2
(45) Date of Patent: Feb. 13, 2007

(54) METHOD OF TWO DIMENSIONAL FEATURE MODEL CALIBRATION AND OPTIMIZATION

(75) Inventors: Thomas Laidig, Point Richmond, CA (US); Jang Fung Chen, Cupertino, CA (US); Xuelong Shi, Santa Clara, CA (US); Ralph Schlief, Mountain View, CA (US); Uwe Hollerbach, Franklin, MA (US); Kurt E. Wampler, Sunnyvale, CA (US)

(73) Assignee: ASML Masktools B.V., Veldhoven (NL)

( * ) Notice: Subject to any disclaimer, the term of this patent is extended or adjusted under 35 U.S.C. 154(b) by 53 days.

(21) Appl. No.: 10/266,922

(22) Filed: Oct. 9, 2002

(65) Prior Publication Data
US 2003/0082463 A1 May 1, 2003

Related U.S. Application Data

(60) Provisional application No. 60/327,302, filed on Oct. 9, 2001.

(51) Int. Cl.
*G03F 1/00* (2006.01)
*G06F 17/50* (2006.01)

(52) U.S. Cl. .................. 430/5; 430/30; 382/144; 700/120; 716/19; 716/20

(58) Field of Classification Search .................. 430/5, 430/30; 700/110, 131, 30, 121, 108, 120; 382/144, 151; 438/16; 257/21.525; 716/19, 716/20, 21; 378/34, 35; 250/492.2, 492.3
See application file for complete search history.

(56) References Cited

U.S. PATENT DOCUMENTS 4,894,790 A  1/1990 Yotsuya et al.

(Continued)

OTHER PUBLICATIONS

Crisalle et al., "A Comparison of the Optical Projection Lithography Simulators in Sample and Prolith", IEEE Transactions on Semiconductor Manufacturing, vol. 5, No. 1, Feb. 1992, pp. 14-26.

(Continued)

*Primary Examiner*—Thorl Chea
(74) *Attorney, Agent, or Firm*—McDermott Will & Emery LLP

(57) ABSTRACT

A method for generating a photolithography mask for optically transferring a pattern formed in the mask onto a substrate utilizing an imaging system. The method includes the steps of: (a) defining a set of calibration patterns, which are represented in a data format; (b) printing the calibration patterns on a substrate utilizing the given imaging system; (c) determining a first set of contour patterns corresponding to the calibration patterns imaged on the substrate; (d) generating a system pseudo-intensity function, which approximates the imaging performance of the imaging system; (e) determining a second set of contour patterns by utilizing the system pseudo-intensity function to define how the calibration patterns will be imaged in the substrate; (f) comparing the first set of contour patterns and the second set of contour patterns to determine the difference therebetween; (g) adjusting the system pseudo-intensity function until the difference between the first set of contour patterns and the second set of contour patterns is below a predefined criteria; and (h) utilizing the adjusted system pseudo-intensity function to modify the mask so as to provide for optical proximity correction.

20 Claims, 5 Drawing Sheets

U.S. PATENT DOCUMENTS

| | | |
|---|---|---|
| 5,097,138 A | 3/1992 | Wakabayashi et al. |
| 5,307,296 A | 4/1994 | Uchida et al. |
| 5,307,421 A | 4/1994 | Darboux et al. |
| 5,319,564 A | 6/1994 | Smayling et al. |
| 5,416,729 A | 5/1995 | Leon et al. |
| 5,621,652 A | 4/1997 | Eakin |
| 5,795,688 A | 8/1998 | Burdorf et al. |
| 5,825,647 A | 10/1998 | Tsudaka |
| 5,966,312 A | 10/1999 | Chen |
| 6,081,659 A | 6/2000 | Garza et al. |
| 6,289,499 B1 | 9/2001 | Rieger et al. |
| 2003/0126581 A1 | 7/2003 | Pang et al. |

OTHER PUBLICATIONS

Gopalarao, et al., "An Integrated Technology CAD System for Process and Device Designers", IEEE Transactions on Very Large Scale Integration (VLSI) Systems, vol. 1, No. 4, Dec. 1993, pp. 482-490.

Neubauer, et al., "Imaging VLSI Cross Sections by Atomic Force Microscopy", 1992 IEEE/IRPS, pp. 299-303.

Rodgers, "Application of the Atomic Force Microscope to Integrated Circuit Reliability and Failure Analysis", 1991 IEEE/IRPS, pp. 250-254.

Qian et al., "A New Scalar Planewave Model for High NA Lithography Simulations", 1994 IEEE, pp. 45-48.

Barouch, et al., "Modeling Process Latitude in UV Projection Lithography", IEEE Electron Device Letters, vol. 12, No. 10, Oct. 1991, pp. 513-514.

Beacham, et al., "Applications of an Atomic Force Metrology System in Semiconductor Manufacturing", SPIE, vol. 1926, pp. 311-321.

"AFMs: What Will Their Role Be?", Semiconductor International, Aug. 1993, pp. 62-68.

Pati, et al., "Exploiting Structure in Fast Aerial Image Computation for Integrated Circuit Patterns", IEEE Transactions on Semiconductor Manufacturing, vol. 10, No. 1, Feb. 1997, pp. 62-74.

Prolith/2 User's Manual, Finle Technologies, Version 3.0 for the Macintosh.

Pati Y.C, et al. "Exploiting Structure in Fast Aerial Image Computation for Integrated Circuit Patterns." IEEE Transactions on Semiconductor Manufacturing, Feb. 1997, IEEE, USA, vol. 10, No. 1, pp. 62-74, XP002256517.

Mark C A. et al "Metrology, Inspection, and Process Control for Microlithography XV." Santa Clara CA, Feb. 26, 2001-Mar. 1, 2001, vol. 4344, pp. 377-384, XP 008022568.

Cobb N, et al. "Mathematical and CAD Framework for Proximity Correction." Optical Microlithography IX, Santa Clara, CA, Mar. 13-15, 1996, vol. 2726, pp. 208-222, XP008022569.

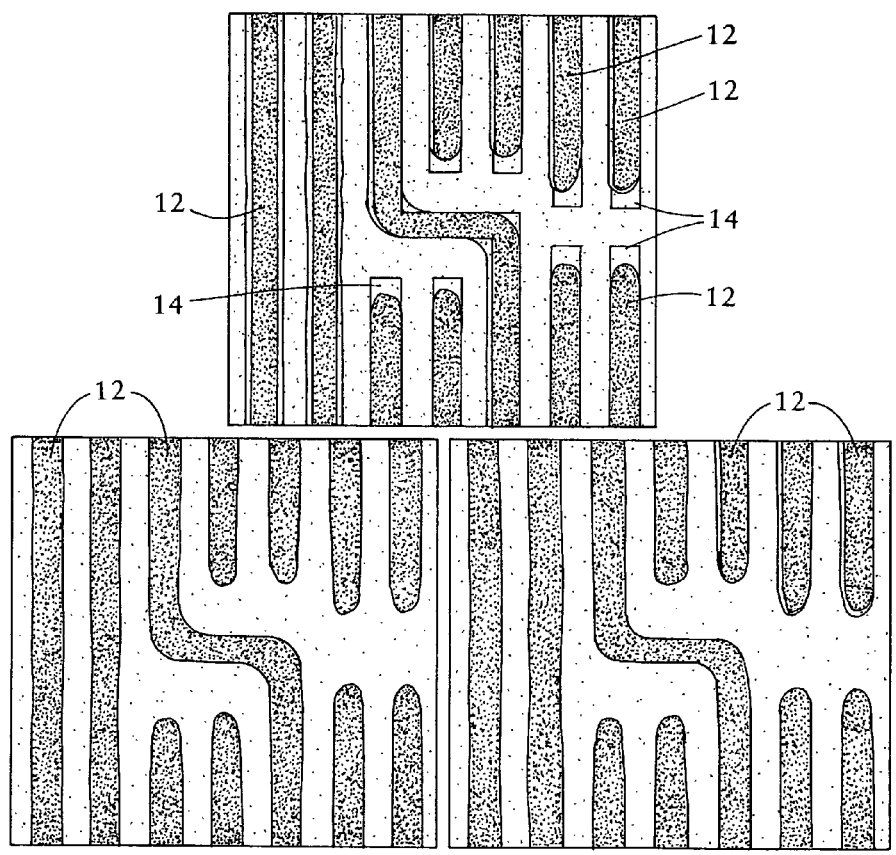

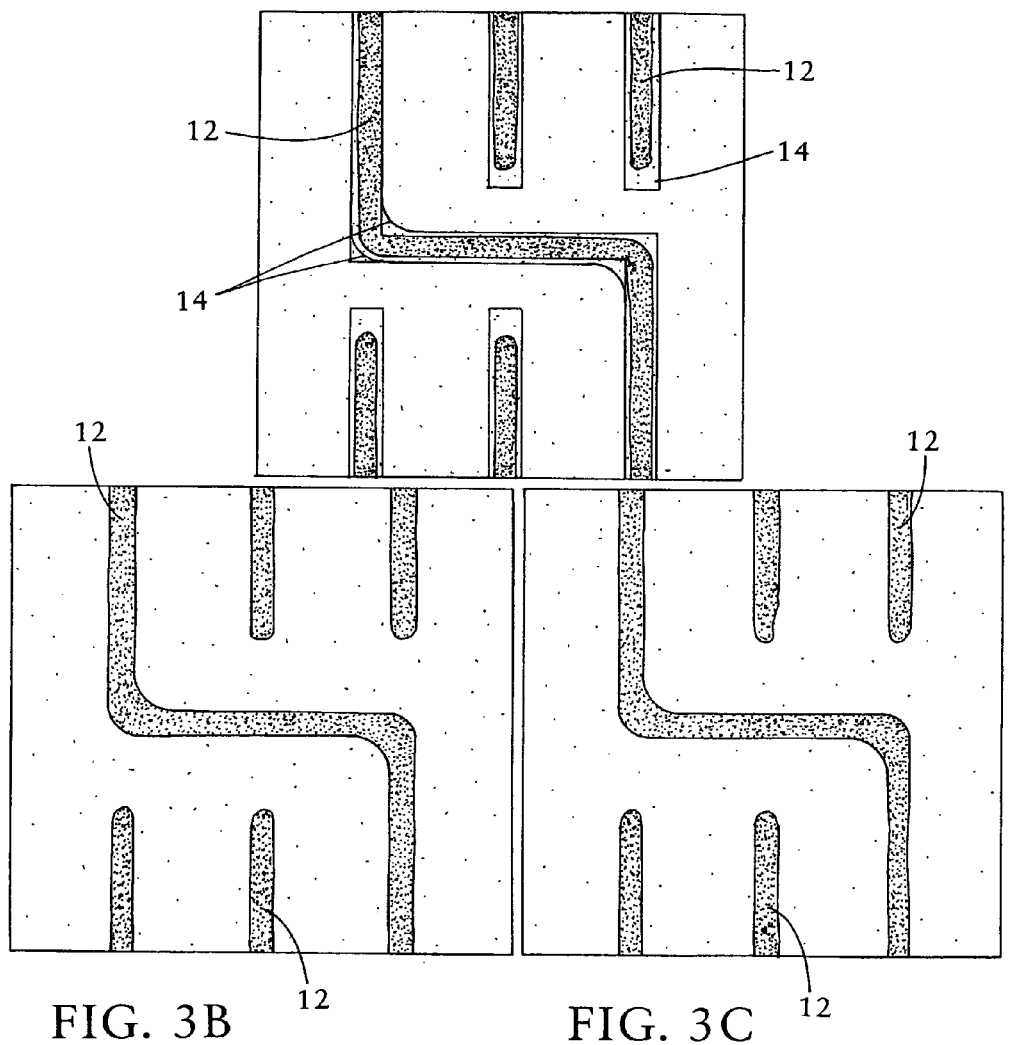

METHOD OF TWO DIMENSIONAL FEATURE MODEL CALIBRATION AND OPTIMIZATION

RELATED APPLICATIONS

This application claims priority from U.S. Provisional Patent Application Ser. No. 60/327,302, filed Oct. 9, 2001, entitled METHOD FOR 2D PATTERN PROFILE CALIBRATION AND VERIFICATION WITH APPLICATION TO MODEL-BASED OPTICAL PROXIMITY CORRECTION.

FIELD OF THE INVENTION

The present invention generally relates to photolithography, and in particular to a method of generating a known set of functions (i.e., calibrated model) defining the performance of an imaging system which are subsequently utilized to correct for optical proximity effects and to improve the printing of mask patterns on substrates.

The present invention also relates to the use of such a calibration technique in a lithographic projection apparatus, which generally comprises:
- a radiation system for supplying a projection beam of radiation;
- a support structure for supporting patterning means (e.g., mask), the patterning means serving to pattern the projection beam according to a desired pattern;
- a substrate table for holding a substrate; and
- a projection system for projecting the patterned beam onto a target portion of the substrate.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

As the critical dimensions of the circuit layout become smaller and approach the resolution value of the exposure tool, the correspondence between the mask pattern and the actual circuit pattern developed on the photoresist layer can be significantly reduced. The degree and amount of differences in the mask and actual circuit patterns depends on the proximity of the circuit features to one another. Accordingly, pattern transference problems are referred to as "proximity effects."

To help overcome the significant problem of proximity effects, a number of techniques are used to add sub-lithographic features to mask patterns. Sub-lithographic features have dimensions less than the resolution of the exposure tool, and therefore do not transfer to the photoresist layer. Instead, sub-lithographic features interact with the original mask pattern and compensate for proximity effects, thereby improving the final transferred circuit pattern.

Examples of such sub-lithographic features are scattering bars and anti-scattering bars, such as disclosed in U.S. Pat. No. 5,821,014 (incorporated herein by reference), which are added to mask patterns to reduce differences between features within a mask pattern caused by proximity effects. More specifically, sub-resolution assist features, or scattering bars, have been used as a means to correct for optical proximity effects and have been shown to be effective for increasing the overall process window (i.e., the ability to consistently print features having a specified CD regardless of whether or not the features are isolated or densely packed relative to adjacent features). As set forth in the '014 patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer.

For the intermediate pitch features pitches, where there is no room to insert SB, a typical method of optical proximity correction (OPC) is to adjust the feature edges (or apply bias) so that the printed feature width is closer to the intended width. In order for the use of the sub-resolution features and/or feature biasing to be effective for minimizing optical proximity effects, an operator having a substantial amount of knowledge regarding mask design and the printing process, as well as a substantial amount of experience, is required to modify the mask design to include the sub-resolution features and/or the adjustment of feature edges (biasing) if the desired goal is to be obtained. Indeed, even when an experienced operator performs this task, it is often necessary to conduct a "trial and error" process in order to properly position the subresolution features to obtain the desired corrections. This trial and error process, which can entail repeated mask revisions followed by repeated simulations, can become both a time consuming and costly process.

Another known method of correcting for optical proximity effects (OPE) entails attempting to "calibrate" the printing process so as to compensate for the OPEs. Currently known techniques include "correlating" so-called calibration parameters to the OPC model, which requires performing a set of detailed SEM CD measurements at various feature sites. Regardless of the actual feature shape, these are 1D width measurements. The more measurement data collected, the better the precision of the calibration parameters. However, for a reliable model parameter calibration, it is not unusual to require more than several hundreds of CD measurements at various critical feature sites under different neighboring environments. These are labor intensive and time consuming work. Worse, how the measurement CDs were taken can often become operator dependent due to the experience level, which can obviously impact the parameter calibration negatively, thereby limiting the overall effectiveness of the technique.

Accordingly, there exists a need for a method of generating a set of parameters (or calibration factors) that define the printing performance of a given imaging system such that the parameters can be utilized to automatically correct for and/or minimize optical proximity effects associated with the given imaging system without having the operator perform the "trial and error" mask modification process noted above. Moreover, it is necessary to have an automated calibration and optimization process to generate a set of precision model parameters that are based on actual 2D wafer patterns with minimum operator dependency for consistent results.

SUMMARY OF THE INVENTION

In an effort to solve the aforementioned needs, it is an object of the present invention to provide an automated method of generating a set of optimized parameters (or calibration factors) using the printed 2D wafer patterns that define the printing performance of a given imaging system such that the parameters can be utilized to automatically correct for and/or minimize optical proximity effects associated with the given imaging system without either having the operator perform the "trial and error" mask modification process or having to collect significant amounts of 1D SEM CD data, which is very labor intensive process as noted above.

More specifically, the method of the present invention relates to the generation of a photolithography mask for optically transferring a pattern formed in the mask onto a substrate utilizing an imaging system. The method includes the steps of: (a) defining a set of calibration patterns, which are represented in a data format; (b) printing the calibration patterns on a substrate utilizing the given imaging system; (c) determining a first set of contour patterns from the calibration patterns that are imaged on the substrate; (d) generating a system pseudo-intensity function (SPIF), which can closely represent the imaging performance of the imaging system; (e) determining a second set of contour patterns by utilizing the system pseudo-intensity function to define how the calibration patterns (in terms of design data) will be imaged in the substrate; (f) comparing the first set of contour patterns and the second set of contour patterns to determine the difference therebetween; (g) adjusting either the parameters of the system pseudo-intensity function or the actual function itself until the difference between the first set of contour patterns and the second set of contour patterns is below a predefined criteria; and (h) utilizing the adjusted system pseudo-intensity function to modify the mask so as to provide for optical proximity correction.

As described in further detail below, the present invention provides significant advantages over the prior art. For example, by using auto extracted 2D contour of printed wafer patterns for SPIF model calibration and optimization, it is possible to more realistically represent the actual wafer features in question. In addition, by accurately modeling the imaging performance of the given imaging system by utilizing the system pseudo-intensity function, it is possible to automatically make adjustments in the mask design that compensate for optical proximity effects as well as other factors that degrade imaging performance. Importantly, the method of the present invention eliminates the need for someone highly skilled in image processing to perform the "trial and error" approach of correcting for optical proximity effects or for someone to perform a labor-intensive collection of 1D SEM CD data measurements that is typically utilized. As such, the present invention results in a substantial savings in both the time and cost necessary to generate a viable mask design. Further, by utilizing the actual 2D pattern contour as input for calibration and optimization, the present invention utilizes much "richer" data information to describe the actual wafer patterns, and therefore obtains more accurate model parameter results.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed for photomask patterning calibration and photo resist modeling, and wafer etched pattern modeling, and in general for 2D pattern calibration applications such as integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other patterning calibration purposes that include:

- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

BRIEF DESCRIPTION OF THE DRAWINGS

FIG. 2A illustrates an exemplary dense feature pattern that has not been subjected to a calibration process.

FIG. 2B illustrates the dense feature pattern of FIG. 2A printed utilizing a first set of calibration factors determined utilizing the method of the present invention.

FIG. 2C illustrates the dense feature pattern of FIG. 2A printed utilizing a second set of calibration factors determined utilizing the method of the present invention.

FIG. 3A illustrates an exemplary semi-isolated feature pattern that has not been subjected to a calibration process.

FIG. 3B illustrates the semi-isolated feature pattern of FIG. 3A printed utilizing a first set of calibration factors determined utilizing the method of the present invention.

FIG. 3C illustrates the semi-isolated feature pattern of FIG. 3A printed utilizing a second set of calibration factors determined utilizing the method of the present invention.

DETAILED DESCRIPTION OF THE INVENTION

In accordance with the present invention, a method is disclosed for calibrating an imaging system by determining a set of performance parameters (i.e., calibration model) which define the printing performance of the given imaging system. The performance parameters are determined for multiple types of features that may be printed in a typical mask design (e.g., densely-spaced features, semi-isolated features, isolated features, line-ends, elbows, etc.). As explained in more detail below, the performance parameters are utilized to determine how a mask should be modified such that the desired feature is accurately printed on the wafer (i.e., the resulting resist pattern formed by the mask accurately corresponds to the desired feature).

Once the performance parameters (or calibrated model) have been determined for a sufficient number of features, the performance parameters are utilized to compensate for optical proximity errors occurring during photoresist printing (or after etching) under the same process conditions for the other types of features utilized in the given mask design. One such imaging model can be expressed as system pseudo-intensity function, or SPIF, as shown:

$$SPIF(x, y) = \sum_{i=1}^{n} \alpha_i |M(x, y) * \Psi_i(x, y)|^2$$

where, $\alpha_i$ is a weighting coefficient to be calibrated and optimized;

$M(x, y)$ is the mask transmission function;

$\Psi_i(x, y)$ is the set of basis functions that have been chosen to represent optical imaging system, e.g., the Eigen functions of a theoretical optical-system;

x, y are the location of wafer pattern; and

* is the convolution operator.

By utilizing the SPIF to predict how a given design pattern would print, it is possible to optimize the design to print the desired ("target") pattern. For this type of optimization process, one can use any well-established optimization method, for example, such as Levenberg-Marquardt. In other words, the performance parameters allow for the pre-correction of the mask data for the features to be printed such that the resulting mask pattern printed on the wafer more closely resembles the desired pattern. As such, the method of the present invention, which entails generating a calibrated model (i.e., performance parameters), allows for automatic model-based optical proximity corrections (OPC) for the mask patterns. It is noted that the method of the present invention can also be applied in order to verify the intended performance of OPC'd mask patterns.

The following summarizes the typical process flow for the optimization loop of the present invention:

1. "SPIF prediction" process:
   a. Compute continuous threshold SPIF, and
   b. Trace polygon contour around the above threshold (or>1, as typical threshold setting) areas.
2. "OPC" process:
   a. Perform "SPIF prediction",
   b. Compare results to the desired,
   c. If acceptable, then the optimization is done, and
   d. If not acceptable, adjust the design edges in opposite direction of the error.

Figure 1:
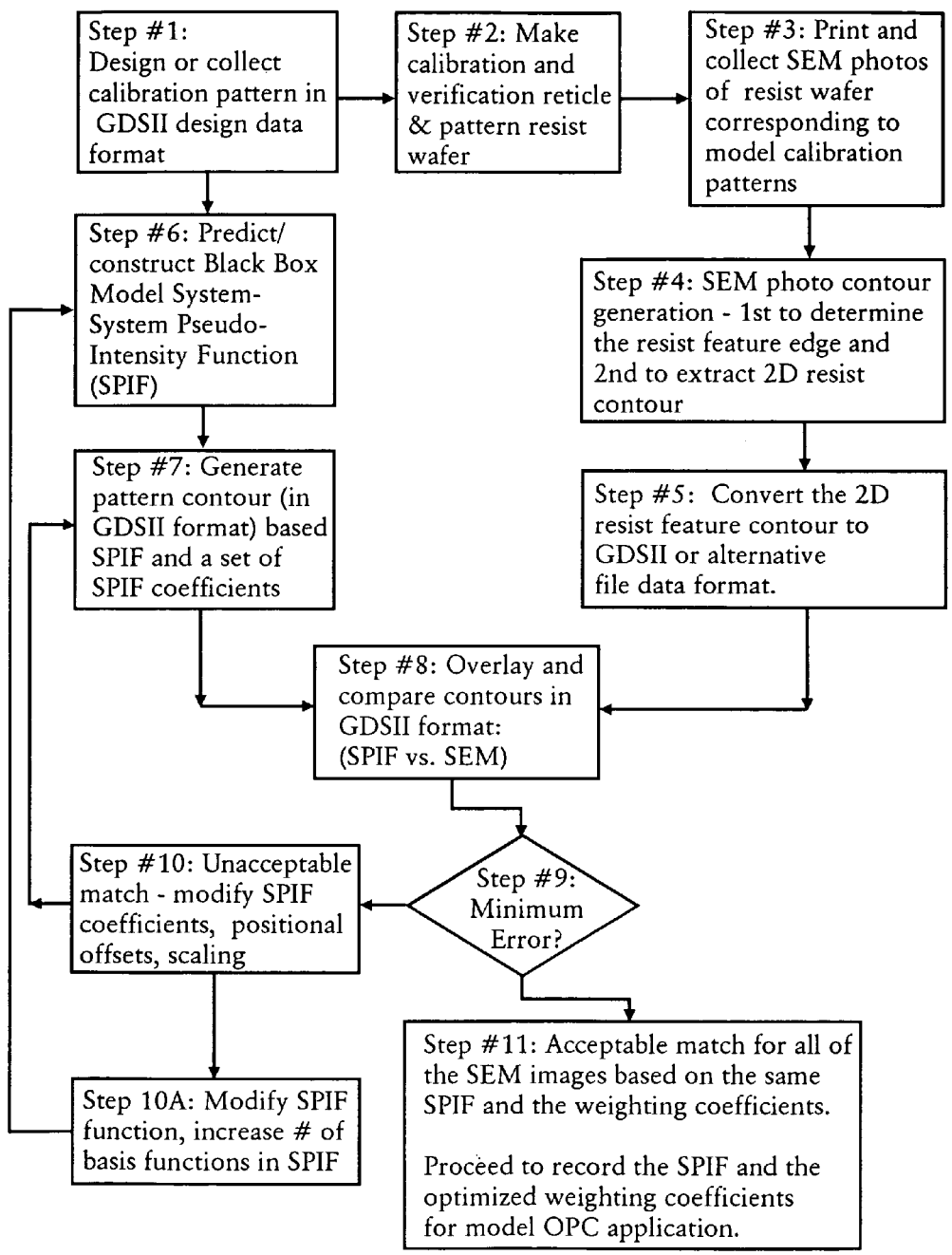
FIG. 1 is a flow chart illustrating an exemplary embodiment of the calibration method of the present invention.

FIG. 1 is a flow chart illustrating an exemplary embodiment of the calibration method of the present invention. The exemplary method of the present invention will now be described.

The first step in the process (Step 1) entails designing (or determining) a set of patterns, referred to as calibration patterns, that are representative of the actual features to be printed on the wafer, including for example, but not limited to, dense line/space patterns, semi-isolated line/space patterns and isolated line/space patterns. Preferably, the patterns contain turns, elbows, etc. In addition, it is noted that generally speaking, the more calibration patterns that are obtained, the more accurately the method of the present invention can correct for OPE in printed wafers. For example, in one embodiment, numerous line/space patterns all of which can be considered dense are determined, along with numerous line/space patterns for semi-dense and isolated line/space patterns. As explained below in more detail, the more calibration patterns that are collected or determined, the less the method will have to interpolate between known calibration patterns when correcting the actual features included in the mask. In other words, the more calibration patterns that are obtained, the more closely an actual feature to be printed will correspond (i.e., match) to a pre-determined calibration pattern. It is noted that in one embodiment of the present invention, the calibration patterns are represented by polygon figures. A polygon is a many sided 2D figure that is usually described by a set of (X, Y) vertices. GDSII Stream™ is one commonly used data format in the semiconductor industry to represent 2D polygon figures for IC design data. However, any other suitable data format capable of representing mask designs can be utilized.

Step 2 in the process entails forming a mask corresponding to the calibration patterns defined in Step 1, and printing the calibration patterns formed in the mask on a wafer. It is noted that the calibration patterns should be printed utilizing the exact same process and steps to be utilized in the production of the commercial semiconductor device, for which the calibration process is being performed.

Once the calibration patterns have been printed on the wafer, the next step (Step 3) entails imaging and measuring the calibration patterns formed on the processed silicon wafer with resist patterning. The imaging may be accomplished utilizing, for example, a SEM (scanning electron microscope) device. It is noted that the measurement may be, for example, a top-down SEM or a cross-sectional CD (critical dimension) SEM. In the current embodiment, it is preferable to utilize a top-down SEM CD and with a corresponding SEM image for each of the calibration patterns to be measured. It is further noted that for the best calibration performance, it is preferred to have SEM images with sufficient magnification. For example, for 130 nm and below design rule, the preferred SEM image magnification is above 70 KX. Under such a high magnification, the main pattern in question can easily occupy the entire field of view and it is typically unlikely to have any additional room for alignment marks as a part of SEM image for alignment and scaling purpose. As such, as explained below, it is preferable to have both image rotation and scaling included as a part of this novel optimization scheme.

Figures 4A, 4B, 4C:
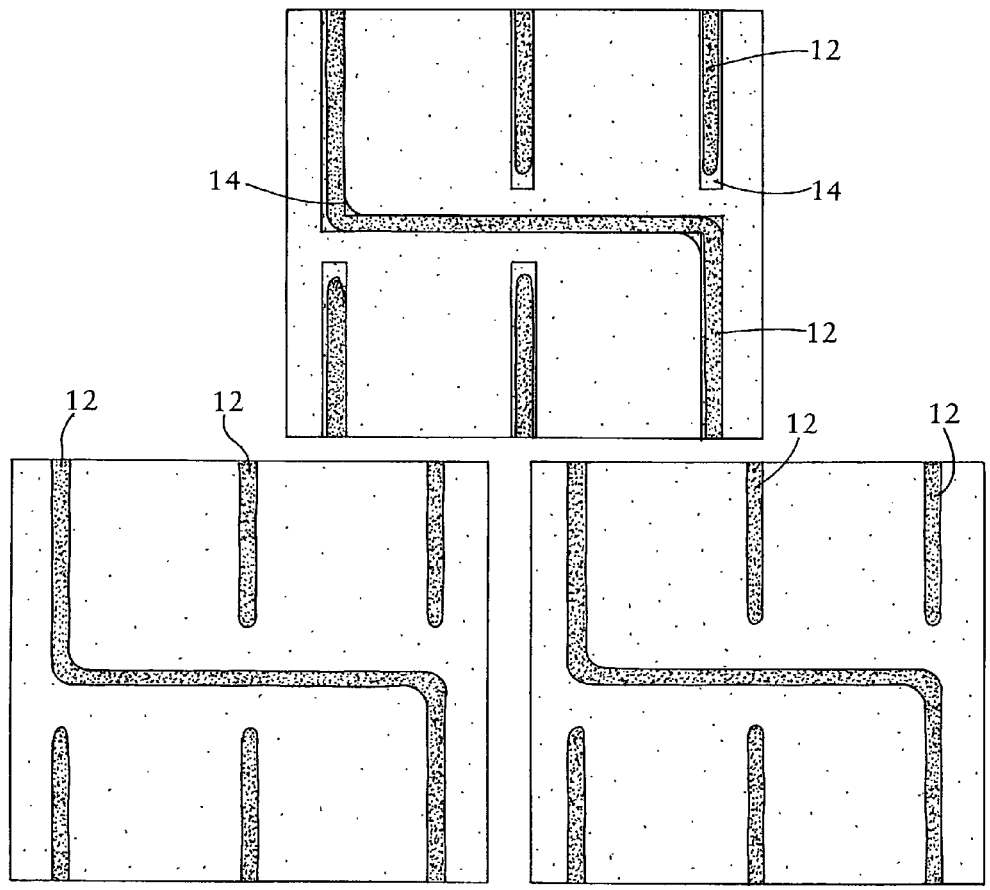
FIG. 4A illustrates an exemplary isolated feature pattern that has not been subjected to a calibration process.
FIG. 4B illustrates the isolated feature pattern of FIG. 4A printed utilizing a first set of calibration factors determined utilizing the method of the present invention.
FIG. 4C illustrates the isolated feature pattern of FIG. 4A printed utilizing a second set of calibration factors determined utilizing the method of the present invention.

FIGS. 2A, 3A and 4A illustrate SEM images of resulting dense, semi-isolated and isolated line/space patterns, respectively, imaged on the wafer. It is noted that the resulting SEM contours 12 are overlaid on the original polygon design data (which represents an ideal imaging process) so as to allow a comparison of the desired pattern (defined by the polygon data) and the actual pattern printed by the imaging process (defined by the SEM image). Referring to FIG. 2A, for example, it can be seen that the resulting SEM image of the resulting pattern is less than perfect, due, for example, to optical proximity effects. One issue is the line shortening, which is illustrated by the difference in the end of a line in the SEM image and the ideal location of the line end determined by the polygon data (reference 14 denotes the gap caused by the line shortening). FIGS. 3A and 4A illustrate similar deficiencies in the respective patterns.

Turning again to FIG. 1, in Step 4, the resulting SEM images undergo digital image processing and thresholding to extract the 2-dimensional photoresist contours. The smooth contours are approximated by many-sided polygons. In other words, the outline of the remaining resist pattern on the wafer, which defines the patterns imaged by the system, is identified and digitally processed.

In the next step (Step 5), the 2-D photoresist contours obtained in Step 4 are converted (or approximated by) into the polygons or any other suitable format, such as the GDSII Stream™. It is noted that the data format utilized should be the same as that utilized in Step 1 to represent the calibration patterns. It should be clear that the SEM images represent the result of the calibration patterns being actually printed on the wafer. Thus, the differences between the SEM images and the calibration patterns represent the "errors" inherent in the imaging system and printing process.

As explained below, the conversion of the 2-D photoresist contours to the polygon data format allows for the comparison of the resist printing (or after pattern etched) performance directly with a model function which represents the performance of the imaging system. The actual images obtained in Step 4 are utilized to "tune" the model function so the function accurately represents the printing performance of the imaging system. This allows for the function to be utilized to automatically modify the mask design so as to compensate for deficiencies in the printing performance of the imaging system original polygon design data. In other words, the function can be utilized to provide optical proximity corrections.

Subsequent to contour extraction, SEM images are initially roughly overlaid with the original mask data pattern. It is conceivable that positional offset in both X and Y directions exist. By comparing a predetermined reference point(s) (e.g., the center of a desired square feature) of the original design and the SEM images, it is possible to determine if the printing process has caused a shift, rotation and/or scaling of the feature to be printed. It is noted that any suitable reference point(s) (e.g., center of feature, a given edge or corner of the feature, etc.) can be utilized as a reference point for the comparison. The process of the present invention allows a simultaneous optimization for both $\alpha_i$ and positional offset (e.g., shifting and rotation). Similarly, the optimization can adjust the SEM scaling factor during the optimization loop. This can be expressed as seen in the following matrix operation:

$$\begin{bmatrix} A & B \\ C & D \end{bmatrix} \begin{bmatrix} x \\ y \end{bmatrix} = \begin{bmatrix} x' \\ y' \end{bmatrix}$$

where,

A is X scaling factor and D is Y scaling factor;

C is rotation and D is the skew of the SEM images; and

X and Y represent the initial position and X' and Y' is the new position.

It is important to note that the A, B, C, and D are separately optimized in one optimization loop but for the same set of SEM images, it is assumed that A, B, C, and D should remain constant. This is a practical assumption as the SEM should remain sufficiently stable and the SEM images are consistently produced in one operation session.

Next, in Step 6, a set of System Pseudo-Intensity Functions (SPIFs) are generated. The SPIFs are functions intended to represent the combined response of the imaging and the resist system as a 2-D scalar function so that an approximation of the printed resist contour can be obtained by sampling the SPIF at a predefined threshold value. This refers to converting the continuously varying SPIF to a discrete function that is "1" where SPIF is greater than threshold and "0" elsewhere. The chosen threshold is rather arbitrary. The optimized SPIF is optimized for a given threshold value. Thus, once the SPIFs are defined for a given imaging system and process, it is possible to approximate how a given pattern will be printed on a wafer. It is noted that SPIFs will vary from imaging system to imaging system and from process to process. The corresponded weighting coefficients ($\alpha_i$) for the SPIF set need to be optimized. Referring to FIGS. 2 and 3 for the threshold SPIF patterns (that have been overlaid with the wafer pattern contour).

In Step 7, the SPIFs and corresponding weighting coefficients generated in Step 6 are utilized in conjunction with the POLYGON design data obtained in Step 1 to generate an approximation of the resist pattern contours that would result from printing the calibration patterns defined in Step 1. It is again noted that the SPIFs represent an approximation of how the imaging system behaves. Thus, by applying the SPIFs to the calibration patterns of Step 1 it is possible to approximate the operation of the imaging system, and the resulting resist contour patterns. It is preferable that the approximation of the resist contour patterns generated in Step 7 be generated in the same data format utilized to generate the calibration patterns in Step 1 and the representation of the actual contour patterns in Step 5, which in the current example, is polygon format. (Refer to the "SPIF prediction process") It is noted that Steps 6 and 7 of the method illustrated in FIG. 1 are distinct from Steps 2–5 and performed independently from Steps 2–5. As such, it is possible to perform Steps 6 and 7 prior to, concurrently, or after, Steps 2–5.

Once the resist contour patterns have been approximated utilizing the SPIFs (Step 7), the next step (Step 8) entails comparing the approximated contour patterns to the contour patterns generated by actually printing the calibration patterns utilizing the given imaging system. More specifically, the predicted pattern contours (generated utilizing the SPIFs) are compared to the contour patterns extracted from the corresponding SEM image. Then, the SPIF set and the corresponded weighting coefficients are varied until a sufficiently close match between the SPIF contour pattern and the SEM contour pattern is obtained. For example, as explained below in further detail, assuming the feature being considered exhibits a square shape, and the resulting SEM contour pattern exhibits a circular configuration (due to corner rounding), the coefficients of the SPIF function will be adjusted until the resulting contour pattern generated by the SPIF function exhibits a substantially circular configuration.

More specifically, upon completing the comparison in Step 8, the process proceeds to Step 9 to determine whether or not the SPIF generated contour patterns are sufficiently close (i.e., match) the SEM contour patterns. Criteria for determining whether or not the contour patterns sufficiently match one another include, for example, but not limited to, the (1) the error in the overlapping areas between the model (SPIF generated) and experimental contours (SEM), (2) the distance between the contours (absolute or signed), either at selected points or at all contour points, and (3) the sum of the squares of the distances between the two contours. These criteria, referred to as cost functions, are minimized in the course of the fitting procedure. Once the criteria is selected, an associated value is determined, which is then utilized as the deciding factor in Step 9. It is noted that the process of Step 9 includes criteria to verify that the positional offset and scaling of the printed features are below an acceptable predefined criteria.

If the error between the SPIF generated contour patterns and the SEM contour patterns is too great (i.e., the criteria of Step 9 is not satisfied), the process proceeds to Step 10, wherein the SPIF coefficients, the positional offsets, scaling and/or skewing factors are modified in an effort to have the resulting SPIF contour patterns more closely correspond to the SEM contour patterns in both shape and position. (Refer to the "OPC process") The process then returns to Step 7 so as to regenerate the contour patterns based on the updated foregoing variables. Thereafter, Steps 8 and 9 are repeated again.

If the error between the SPIF generated contour patterns and the SEM contour patterns remains too great after several iterations of the loop formed by Steps 7–10, the process then proceeds to Step 10A. In Step 10A, the process proceeds to select/construct a new SPIF function and/or increases the number "n" of the basis functions utilized to formulate the SPIF function. The process then returns to Step 6 and proceeds in the manner detailed above, utilizing the new/modified SPIF function.

As is clear from the foregoing, the process proceeds to Step 10A in the event that adjustment of the SPIF weighting coefficients and positional offsets cannot produce an error below the predefined minimum value. It is noted that the determination of when to proceed to Step 10A can be determined, for example, by defining a set number of iterations of loop Steps 7–10 to be performed, and if an acceptable result is not obtained before the number of iterations are completed, the process then proceeds to Step 10A. Alternatively, operator intervention can be utilized to determine when to proceed to Step 10A.

If the SPIF generated contour patterns and SEM contour patterns are sufficiently similar (i.e., the criteria of Step 9 is satisfied), the SPIF and the weighting coefficients are recorded (Step 11). It is noted that this SPIF and the corresponding weighting coefficients represent the actual printing performance of the given imaging system in a functional data format. In other words, the SPIF and the weighting coefficient represent a model of the imaging performance. As such, it can be utilized to predict and therefore compensate for various optical proximity effects that would otherwise degrade the overall printing performance.

Referring to Step 11, it is noted that the foregoing process is repeated until a sufficient number of SEM images have been fitted (i.e., matched) to the same model parameters. This is important since in practice all design patterns must go through the same OPC process to be able to achieve an optimum CD control under the same exposure setting. Preferably, the number of SEM images compared with SPIF generated contours is sufficient to span all possible patterns that are expected to be encountered in a given semiconductor chip mask design. For all feature pitch range and every feature type that have gone through the optimization loop, the same $\alpha_i$ is expected. If the $\alpha_i$ is unsatisfactory, that is, the model performance has resultant error that is greater than a pre-defined tolerance (as an example, the predicted CD error is greater than 4% of the target CD), the optimization loop should allow to increase the "n" or change a different form of $\Psi_i$ and re-start from the step #1.

The above process described is referred to as model training. The same SPIF function set with the corresponded weighting coefficients can be sufficient to fit numerous mask geometry's, such as those with different pitches, feature types, feature sizes, and orientations, etc. Once this empirical model for predicting resist contours has been suitably trained (Step 11), it is employed to make predictions about similar mask patterns. (Refer to the "OPC Process") For example, it can be used in an algorithm that processes mask data to perform model-based optical proximity correction. For example, given a target shape, for example the original mask outline, the algorithm moves the edges of the mask data to decrease the error between the resist contour predicted by the trained model and the target. Model-based OPC becomes an especially important method, as the size of the printed features is comparable or smaller than the exposure wavelength.

An example of the results that can be obtained by the foregoing method is set forth in FIGS. 2B, 2C, 3B, 3C, 4B and 4C. More specifically, using the foregoing method, a set of SPIFs with the corresponding weighting coefficients were utilized to fit the three cases of SEM images shown in FIGS. 2A, 3A and 4A, where FIG. 2A illustrates an uncorrected dense line:space pattern (i.e., 130 nm line at ~1:1 line:space); FIG. 3A illustrates an uncorrected semi-isolated line:space pattern (i.e., 130 nm line at ~1:3.3 line:space); and FIG. 4A illustrates an uncorrected isolated line:space pattern (i.e., 130 nm line at ~1:8.8 line:space). FIGS. 2B, 3B and 4B illustrate "corrected" patterns corresponding to FIGS. 2A, 3A, and 4A, respectively, resulting from utilizing a first set of SPIFs and corresponded weighting coefficients, and FIGS. 2B, 3B and 4B illustrate "corrected" patterns corresponding to FIGS. 2A, 3A, and 4A, respectively, resulting from utilizing a second set of SPIFs and corresponded weighting coefficients. In general, the first set of SPIFs utilized in the correction illustrated in FIGS. 2B, 3B and 4B provides for a better correction (i.e., closer match) as compared to the correction obtain utilizing the second set of SPIFs as illustrated in FIGS. 2C, 3C and 4C. However, both corrections provide an improvement over the non-corrected imaging, as the resulting image in all "corrected" versions more closely tracks the desired pattern. It is noted that the pattern images appear to be larger in FIGS. 2A–2C, than in FIGS. 3A–4C because it has a smaller plotting range as compared to the plotting range utilized in FIGS. 3A–4C.

Thus, in accordance with the present invention, once determined, the SPIF, which represents the actual performance of the given imaging system, can be utilized to automatically modify (i.e., calibrate) mask designs such that the resulting image printed on the wafer more accurately corresponds to the desired image. In other words, the method of the present invention can be utilized to automatically provide OPC techniques in the mask design, by modifying the various pattern features to be printed in accordance with the determined SPIF function.

It is further noted that one exemplary criterion for specifying error tolerance (e.g., Step 9) is to actually count the non-overlapping pixels between the SEM (light) and the predicted SPIF contours (gray). From the SEM images, it is possible to derive the physical dimensions for each pixel. For example, for 2.0 um by 2.0 um area that has 480×480 imaging pixels, each pixel corresponds to $(4.16 \text{ nm})^2$. It is also noted that for the 130 nm technology generation, it may be necessary to require the error is to be one pixel or less. In other words, the non-overlapped area must not be more than one pixel wide. For finer error specification, it is possible to use a smaller calibration region with the same imaging pixel counts, such as using 0.9 um by 0.9 um for 480×480 pixels. In the later case, each pixel represents $(2 \text{ nm})^2$.

It is noted that the method of the present invention provides important advantages over the prior art. For example, by using auto extracted 2D contour of printed wafer patterns for SPIF model calibration and optimization, it is possible to more realistically represent the actual wafer features in question. In addition, by accurately modeling the imaging performance of the given imaging system by utilizing the system pseudo-intensity function, it is possible to automatically make adjustments in the mask design that compensate for optical proximity effects as well as other factors that degrade imaging performance. Importantly, the method of the present invention eliminates the need for someone highly skilled in image processing to perform the "trial and error" approach of correcting for optical proximity effects or for someone to perform a labor-intensive collection of 1D SEM CD data measurements that is typically utilized. As such, the present invention results in a substantial savings in both the time and cost necessary to generate a viable mask design. Further, by utilizing the actual 2D pattern contour as input for calibration and optimization, the present invention utilizes much "richer" data information to describe the actual wafer patterns, and therefore obtains more accurate model parameter results.

Figure 5:
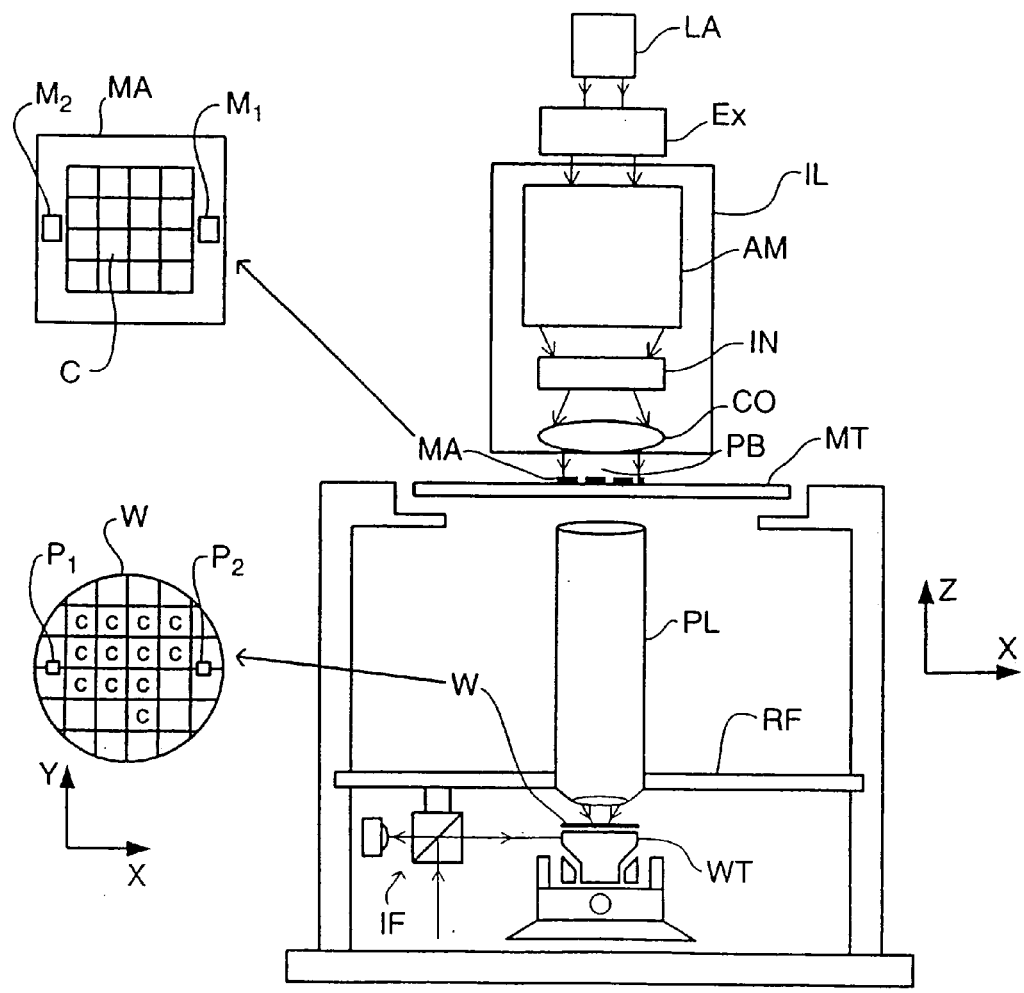
FIG. 5 illustrates an exemplary lithographic projection apparatus.

FIG. 5 schematically depicts a lithographic projection apparatus suitable for use with the calibration method of the present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 5 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 5. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

One another variation of this optimization is that it can be used for calibration 2D photo resist simulation prediction and 2D etched pattern predictions.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating a calibration model, said method comprising the steps of:

defining a set of calibration patterns, said calibration patterns being represented in a data format;

printing said calibration patterns on a substrate utilizing an imaging system;

determining a first set of contour patterns corresponding to said calibration patterns imaged on said substrate, which includes a determination of a positional offset of said first set of contour patterns relative to said calibration patterns and compensating for said positional offset;

generating a system pseudo-intensity function, said system pseudo-intensity function approximating the imaging performance of said imaging system;

determining a second set of contour patterns by utilizing said system pseudo-intensity function to define how said calibration patterns will be imaged in said substrate;

comparing said first set of contour patterns and said second set of contour patterns to determine the difference between said first set of contour patterns and said second set of contour patterns; and adjusting said system pseudo-intensity function until said difference between said first set of contour patterns and said second set of contour patterns is below a predefined error tolerance.

2. The method of claim 1, wherein the data format utilized for representing said calibration patterns is a polygon data format.

3. The method of claim 1, wherein said step of determining a first set of contour patterns corresponding to said calibration patterns comprises the steps of:
- recording said calibration patterns formed on said substrate utilizing a scanning electron microscope, and
- measuring said calibration patterns so as to determine a two-dimensional contour of said calibration patterns, said two-dimensional contour of said calibration patterns corresponding to said first set of contour patterns.

4. The method of claim 3, wherein said recording of said calibration patterns comprises imaging resist patterns corresponding to said calibration patterns.

5. The method of claim 3, further comprising the step of converting said first set of contour patterns into a POLYGON data format.

6. The method of claim 1, wherein said calibration patterns are representative of features to be utilized in a semiconductor device.

7. The method of claim 5, wherein said second set of contour patterns are in said polygon data format.

8. The method of claim 1, wherein said step of adjusting said system pseudo-intensity function comprises adjusting a weighting coefficient associated with said system pseudo-intensity function.

9. The method of claim 1, wherein said step of adjusting said system pseudo-intensity function comprises generating a new system pseudo-intensity function.

10. A method of generating a photolithography mask for optically transferring a pattern formed in said mask onto a substrate, said method comprising the steps of:
- defining a set of calibration patterns, said calibration patterns being represented in a data format;
- printing said calibration patterns on a substrate utilizing an imaging system;
- determining a first set of contour patterns corresponding to said calibration patterns imaged on said substrate, which includes a determination of a positional offset of said first set of contour patterns relative to said calibration patterns and compensating for said positional offset;
- generating a system pseudo-intensity function, said system pseudo-intensity function approximating the imaging performance of said imaging system;
- determining a second set of contour patterns by utilizing said system pseudo-intensity function to define how said calibration patterns will be imaged in said substrate;
- comparing said first set of contour patterns and said second set of contour patterns to determine the difference between said first set of contour patterns and said second set of contour patterns;
- adjusting said system pseudo-intensity function until said difference between said first set of contour patterns and said second set of contour patterns is below a pre-defined error tolerance; and
- utilizing said adjusted system pseudo-intensity function to modify said mask so as to provide for optical proximity correction.

11. The method of claim 10, wherein the data format utilized for representing said calibration patterns is a POLYGON data format.

12. The method of claim 10, wherein said step of determining a first set of contour patterns corresponding to said calibration patterns comprises the steps of:
- recording said calibration patterns formed on said substrate utilizing a scanning electron microscope, and
- measuring said calibration patterns so as to determine a two-dimensional contour of said calibration patterns, said two-dimensional contour of said calibration patterns corresponding to said first set of contour patterns.

13. The method of claim 12, wherein said recording of said calibration patterns comprises imaging resist patterns corresponding to said calibration patterns.

14. The method of claim 12, further comprising the step of converting said first set of contour patterns into a polygon data format.

15. The method of claim 10, wherein said calibration patterns are representative of features to be utilized in a semiconductor device.

16. The method of claim 14, wherein said second set of contour patterns are in said POLYGON data format.

17. The method of claim 10, wherein said step of adjusting said system pseudo-intensity function comprises adjusting a weighting coefficient associated with said system pseudo-intensity function.

18. The method of claim 10, wherein said step of adjusting said system pseudo-intensity function comprises generating a new system pseudo-intensity function.

19. A computer program product for controlling a computer comprising a recording medium readable by the computer, means recorded on the recording medium for directing the computer to generate a calibration model for use in generating a mask for optically transferring a pattern formed in said mask onto a substrate, said generation of said calibration model comprising the steps of:
- defining a set of calibration patterns, said calibration patterns being represented in a data format;
- determining a first set of contour patterns corresponding to said calibration patterns imaged on said substrate, which includes a determination of a positional offset of said first set of contour patterns relative to said calibration patterns and compensating for said positional offset;
- generating a system pseudo-intensity function, said system pseudo-intensity function approximating the imaging performance of said imaging system;
- determining a second set of contour patterns by utilizing said system pseudo-intensity function to define how said calibration patterns will be imaged in said substrate;
- comparing said first set of contour patterns and said second set of contour patterns to determine the difference between said first set of contour patterns and said second set of contour patterns; and
- adjusting said system pseudo-intensity function until said difference between said first set of contour patterns and said second set of contour patterns is below a pre-defined error tolerance.

20. A computer program product for controlling a computer comprising a recording medium readable by the computer, means recorded on the recording medium for directing the computer to generate a mask for optically transferring a pattern formed in said mask onto a substrate, said generation of said mask comprising the steps of:
- defining a set of calibration patterns, said calibration patterns being represented in a data format;
- determining a first set of contour patterns corresponding to said calibration patterns imaged on said substrate, which includes a determination of a positional offset of said first set of contour patterns relative to said calibration patterns and compensating for said positional offset;

generating a system pseudo-intensity function, said system pseudo-intensity function approximating the imaging performance of said imaging system;

determining a second set of contour patterns by utilizing said system pseudo-intensity function to define how said calibration patterns will be imaged in said substrate;

comparing said first set of contour patterns and said second set of contour patterns to determine the difference between said first set of contour patterns and said second set of contour patterns;

adjusting said system pseudo-intensity function until said difference between said first set of contour patterns and said second set of contour patterns is below a predefined error tolerance; and utilizing said adjusted system pseudo-intensity function to modify said mask so as to provide for optical proximity correction.

* * * * *